Oct. 13, 1964 F. F. LADD, JR 3,153,153
ISOLATED HIGH EFFICIENCY INTERSTAGE COUPLING CIRCUIT
Filed Sept. 14, 1961
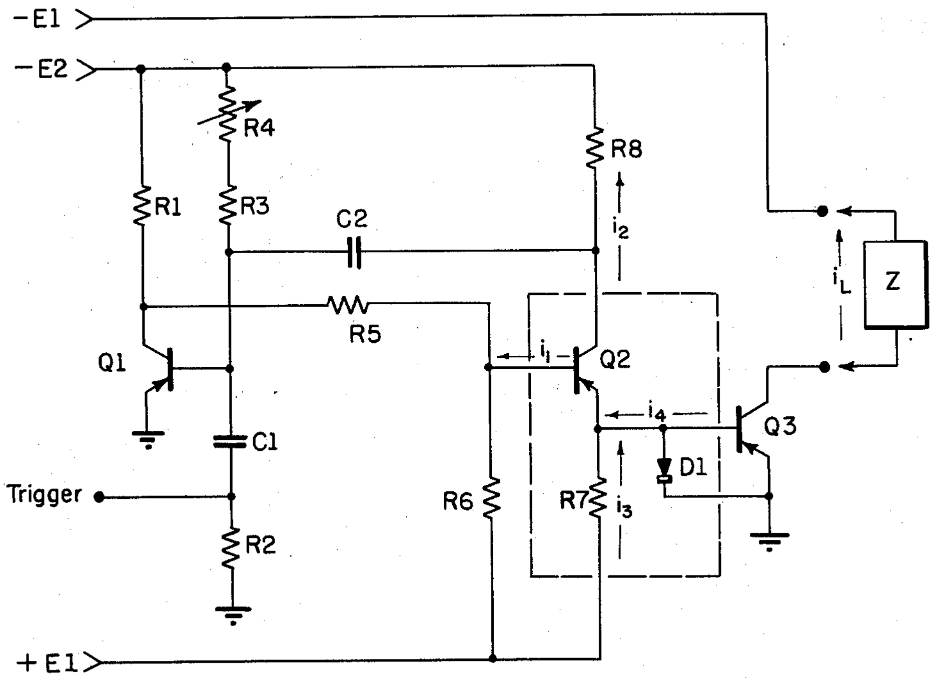
INVENTOR.
FREDERICK F. LADD, JR.
BY Kenway, Jenney & Hildreth
ATTORNEYS United States Patent Office 3,153,153

Patented Oct. 13, 1964

3,153,153

ISOLATED HIGH EFFICIENCY INTERSTAGE COUPLING CIRCUIT

Frederick F. Ladd, Jr., Newbury, Mass., assignor to Anelex Corporation, Boston, Mass., a corporation of New Hampshire Filed Sept. 14, 1961, Ser. No. 138,085
4 Claims. (Cl. 307—88.5)

My invention relates to electronic circuits, and particularly to a novel impedance coupling circuit of high gain and efficiency.

Electronic switching circuits can conveniently be divided into logical components, for processing information, and control components, for performing selected output functions in response to the processed information. Normally, it is desired to operate the logical components at much lower power levels than would be required to execute the output functions, so that power amplification is required. As a specific example, a power transistor may be employed to control the supply of a high level current to a load in response to the state of a monostable circuit operating at a relatively low current level. Obviously, the cost, size and complexity of the circuits required for this purpose depend on the efficiency of the coupling circuit between the monostable circuit and the load, as measured by the power dissipation of the coupling circuit, on the available current gain, and on the complexity of the coupling circuit itself. The object of my invention is to improve the efficiency of coupling between low and high level circuits, while reducing the complexity and improving the gain of the coupling circuit.

My invention is organized about the discovery that a great improvement in current transfer efficiency can be obtained by connecting the control junction of a power transistor in series with the load terminals of a controlling transistor, the latter being connected in a low level switching circuit, in such a way that substantially all of the load current of the controlling transistor flows through the control junction of the power transistor and is available for amplification in the load circuit of the power transistor. In order to prevent the control junction from interfering with the operation of the controlling transistor under back bias conditions, a diode poled oppositely to the control junction of the power transistor is connected across it.

My invention will best be understood by reference to the accompanying drawing, together with the following detailed description, of a preferred embodiment thereof.

In the drawing, the sole figure comprises a schematic wiring diagram of a control circuit including a preferred embodiment of the impedance coupling circuit of my invention.

Referring to the drawing, I have shown a monostable circuit, comprising a pair of transistors Q1 and Q2, connected through the novel coupling circuit of my invention, shown within the dotted lines, to control a power transistor Q3. Transistor Q3 has a collector circuit including a load Z, to be supplied with a load current $i_L$ from a source of voltage —E1, or not, depending on the state of transistors Q1 and Q2.

Transistor Q1 has its emitter grounded, and its collector connected to a suitable source of bias voltage —E2 through a conventional biasing resistor R1. The base of transistor Q1 is connected to ground through a coupling capacitor C1 and a resistor R2, and to terminal —E2 of the bias source through a fixed resistor R3 and a variable resistor R4. A lead is connected to the junction of resistor R2 and capacitor C1 to supply a trigger pulse to the base of transistor Q1, as indicated in the drawing. The base of transistor Q1 is also connected to the collector of transistor Q2 through a suitable coupling capacitor C2, for purposes to be described.

A bias circuit for the base of transistor Q2 is provided by a voltage divider comprising two resistors R5 and R6 connected between the collector of transistor Q1 and one terminal of a source of positive bias voltage +E1, the base of transistor Q2 being connected to the junction of resistors R5 and R6 as shown. The emitter of transistor Q2 is returned to the positive terminal +E1 through a suitable biasing resistor R7, and the collector of transistor Q2 is returned to the negative bias terminal —E2 through a suitable biasing resistor R8.

Transistor Q3 has its emitter grounded, and its collector connected through the load Z to a source of negative potential —E1. The base of transistor Q3 is directly connected to the emitter of transistor Q2, and is connected to ground through a diode D1 poled to clamp the junction of the emitter of transistor Q2 and the base of transistor Q3 to a value at or above ground potential.

In the normal state of the circuit just described, the emitter-base junction of transistor Q1 is forward-biased by a negative voltage from the supply terminal —E2. Transistor Q1 will thus be conducting, and its collector potential will be near ground. As a result, the base of transistor Q2 will be above ground, and transistor Q2 will be cut off.

When a positive-going trigger pulse is applied across resistor R2, it will be coupled to the base of transistor Q1, so that transistor Q1 will be reverse-biased and driven to cutoff, causing its collector potential to drop and reducing the potential at the base of transistor Q2 below ground. Transistor Q2 will now conduct, and its collector potential will rise. The collector potential rise of transistor Q2 is coupled to the base of transistor Q1 through coupling capacitor C, which assists the trigger pulse in driving transistor Q1 to cut off.

With transistor Q2 conducting, its emitter will tend to go below ground potential. Transistor Q3 will then be forward biased, and will conduct until it reaches saturation with the emitter of transistor Q2 at a small negative potential. With the emitter of transistor Q2 clamped by the saturated forward base-emitter current of transistor Q3, transistor Q2 will conduct to a collector saturation value. In this condition, the entire collector current $i_2$ and base current $i_1$ of transistor Q2, with the exception of a small bias current $i_3$ flowing through resistor R7, also flows through the base-emitter junction of transistor Q3, and is available for amplification by transistor Q3. Thus, maximum gain and coupling efficiency are realized.

When the delay period is terminated, transistor Q1 will again be forward-biased and will return to conduction. This action will reduce the potential at the base of transistor Q2, and transistor Q2 will cut off, causing transistor Q3 to cut off and interrupt the supply of current to the load Z.

As will appear, the circuits and component values utilized in the low and high level circuits coupled in accordance with my invention are not critical, since it is merely necessary that the impedance of the parallel circuit comprising the emitter-base junction of the transistor Q3 and the diode D1 be small compared to the load impedance of the low level circuit which it parallels, here resistor R8. However, as an illustrative example, the following components and values may be used in the specific circuits here shown:

| | | |
|---|---|---|
| −E1 | volts | −12 |
| −E2 | do | −6 |
| +E1 | do | +6 |
| R1 | ohms | 680 |
| R2 | do | 4,700 |
| R3 | do | 4,700 |
| R4 | do | 5,000 |
| R5 | do | 3,900 |
| R6 | do | 15,000 |
| R7 | do | 56,000 |
| R8 | do | 680 |
| C1 | micromicrofarads | 750 |
| C2 | do | 10,000 |
| Z | ohms | 47 |

Diode D1 may be a type 1N276, transistor Q1 may be a type 2N404, transistor Q2 may be a type 2N404, and transistor Q3 may be a type 2N660. This specific circuit is adaptable for use as a hammer drive circuit in a high speed printer; when so used, the load Z would comprise the hammer drive coil.

With the circuit constants given above, typical current values are as follows:

$$i_1=0.7 \text{ ma.}$$
$$i_2=8.6 \text{ ma.}$$
$$i_3=0.1 \text{ ma.}$$
$$i_4=9.2 \text{ ma.}$$
$$i_L=250 \text{ ma.}$$

The efficiency $E_f$, given by $$E_f=\frac{i_4\times 100}{i_1+i_2}$$

is then $$\frac{9.2\times 100}{0.7+8.6}=98.9\%$$

The monostable circuit comprising transistor Q1 and Q2 just described is not essential to the practice of my invention, but is typical of the low level switching circuits which may be coupled to power stages by the impedance coupling circuit of my invention. The essential advantage of this coupling circuit resides in causing substantially the entire load current of the low level circuit to flow through the control circuit of the load control device. Structurally, this result requires a load control device having a control circuit of low impedance relative to the load impedance of the low level circuit, connected in multiple with at least a portion of the load circuit impedance of the low level circuit. Since a transistor junction has a low impedance in only one direction of current flow, a diode poled opposite to the junction polarity is connected in parallel with the junction to complete the low impedance path.

While I have described only one embodiment of my invention in detail, many changes and variations will be apparent to those skilled in the art upon reading my description, and such may obviously be made without departing from the scope of my invention. As one specific example, while I have shown transistors of the p-n-p type, n-p-n or mixed n-p-n and p-n-p types may be employed if so desired, with suitable obvious changes in bias potentials and diode polarities.

Having thus disclosed my invention, what I claim is:

1. In combination, a two state switching circuit comprising a transistor having a first load circuit including an impedance through which current flows at a first or a second level in accordance with the state of the circuit, a current amplifier having a second load circuit independent of said first load circuit connected in series with a load and a current source, said current amplifier having a control circuit path comprising two terminals connected to an asymmetric junction poled in a first sense, a diode poled opposite said junction connected in parallel with said junction across said terminals, said terminals being connected in parallel with said impedance to supply current to said first load circuit.

2. In combination, a circuit comprising a first transistor having a load circuit including a load impedance and a control circuit, and a second transistor having a load circuit and a control circuit, the control circuit for said second transistor being connected in series with at least the portion of the load circuit of the first transistor including the transistor and in parallel with at least a portion of the load impedance, and means for supplying load current to said first transistor through the control circuit for said second transistor.

3. In combination, a first circuit including a first transistor having two load terminals and a first load circuit comprising a current source and an impedance connected across said load terminals, means for switching said transistor from a first nonconducting state to a second conducting state, a second circuit including a second transistor having two load terminals and a control junction, said control junction being connected in series with the load terminals of said first transistor and in parallel with said impedance, a second load circuit independent of said first load circuit connected across the load terminals of said second transistor, and means for supplying current through said control junction to said first transistor in the second state of said first transistor.

4. In combination, a current source having first, second and third terminals at a first, a second, and an intermediate potential, respectively, a first transistor having two load terminals, a load circuit comprising an impedance and said load terminals connected in series across said first and second terminals, means for switching said first transistor between conducting and non-conducting states, a second transistor having a control junction connected between one terminal of said first transistor and said third terminal and biased to supply current to said first transistor in its conducting state, a diode poled opposite to said junction and connected thereacross, a load impedance, and means controlled by said second transistor for independently supplying current to said load impedance in the conducting state of said first transistor.

References Cited in the file of this patent

UNITED STATES PATENTS

| | | |
|---|---|---|
| 2,837,663 | Walz | June 3, 1958 |
| 2,949,543 | Nordahl et al. | Aug. 16, 1960 |